United States Patent
Zhong et al.

(10) Patent No.: US 9,493,351 B2
(45) Date of Patent: Nov. 15, 2016

(54) METHODS OF PRODUCING CADMIUM SELENIDE MULTI-POD NANOCRYSTALS

(75) Inventors: Xinhua Zhong, Shanghai (CN); Wenjin Zhang, Shanghai (CN)

(73) Assignee: East China University of Science and Technology, Shanghai (CN)

( * ) Notice: Subject to any disclaimer, the term of this patent is extended or adjusted under 35 U.S.C. 154(b) by 517 days.

(21) Appl. No.: 13/811,835

(22) PCT Filed: Dec. 7, 2011

(86) PCT No.: PCT/CN2011/083639
§ 371 (c)(1),
(2), (4) Date: Jan. 23, 2013

(87) PCT Pub. No.: WO2013/082772
PCT Pub. Date: Jun. 13, 2013

(65) Prior Publication Data
US 2013/0183442 A1 Jul. 18, 2013

(51) Int. Cl.
*C01B 19/00* (2006.01)
*C30B 9/08* (2006.01)
*C30B 29/46* (2006.01)
*C30B 29/62* (2006.01)

(52) U.S. Cl.
CPC ............... *C01B 19/007* (2013.01); *C30B 9/08* (2013.01); *C30B 29/46* (2013.01); *C30B 29/62* (2013.01)

(58) Field of Classification Search
None
See application file for complete search history.

(56) References Cited

U.S. PATENT DOCUMENTS

| | | | |
|---|---|---|---|
| 6,322,901 B1 * | 11/2001 | Bawendi | ............. C01B 17/20 257/E33.004 |
| 7,160,489 B2 | 1/2007 | Didenko et al. | |
| 7,465,352 B2 | 12/2008 | Cao | |
| 8,017,181 B2 | 9/2011 | Shin et al. | |
| 2003/0145779 A1 | 8/2003 | Alivisatos et al. | |
| 2005/0109269 A1 * | 5/2005 | Alivisatos | ............ C30B 7/00 117/68 |
| 2006/0019427 A1 | 1/2006 | Cao | |
| 2007/0186846 A1 | 8/2007 | Yong et al. | |
| 2007/0204790 A1 | 9/2007 | Alkhawaldeh et al. | |
| 2009/0020710 A1 | 1/2009 | Yu et al. | |
| 2010/0062154 A1 * | 3/2010 | Shin et al. | .................. 427/214 |
| 2011/0033368 A1 * | 2/2011 | Ye | ......................... B82Y 30/00 423/509 |
| 2011/0233468 A1 * | 9/2011 | Zong et al. | ............ 252/301.6 R |

FOREIGN PATENT DOCUMENTS

| | | |
|---|---|---|
| CA | 2642766 A1 | 8/2007 |
| CN | 1710154 A | 12/2005 |

(Continued)

OTHER PUBLICATIONS

Sun et al, Colloids and Surfaces A: Physicochem. Eng. Aspects, 350, pp. 91-100, 2009.*

(Continued)

*Primary Examiner* — Erma Cameron
(74) *Attorney, Agent, or Firm* — Pepper Hamilton LLP

(57) ABSTRACT

Methods for the non-hot-injection synthesis of semiconductor nanocrystals are described. For example, a multi-podal cadmium selenide nanocrystal may be produced by a method including heating a degassed mixture comprising cadmium oxide, selenium, trioctylphosphine, and a carboxylic acid in a non-coordinating solvent from about room temperature to about 210° C., where the multi-podal cadmium selenide nanocrystal may be a tetrapodal cadmium selenide nanocrystal.

25 Claims, 1 Drawing Sheet

(56) References Cited

FOREIGN PATENT DOCUMENTS

| | | |
|---|---|---|
| CN | 1843935 A | 10/2006 |
| CN | 1920123 A | 2/2007 |
| CN | 201120278 Y | 9/2008 |
| CN | 101374980 A | 2/2009 |
| CN | 101457403 A | 6/2009 |
| CN | 101671007 B | 3/2010 |
| EP | 1969164 A2 | 9/2008 |
| JP | 2005530666 A | 10/2005 |
| JP | 2009521389 A | 6/2009 |
| JP | 2010234367 A | 10/2010 |
| JP | 2010540398 A | 12/2010 |
| KR | 20080081180 A | 9/2008 |
| WO | WO2007075886 A2 | 7/2007 |
| WO | WO2007095723 A1 | 8/2007 |

OTHER PUBLICATIONS

Definition of "ligand": p. 698 of Hawley's Condensed Chemical Dictionary. $12^{th}$ edition, 1993.*

Manna et al, JACS, 124, pp. 7136-7145, 2002.*

International Search Report and Written Opinion for PCT/CN2011/083639 dated Oct. 18, 2012.

Asokan et al., Shape-controlled Synthesis of CdSe Tetrapods Using Cationic Surfactant Ligands, *Small* (Apr. 30, 2007), 3(7):1164-1169 (Abstract).

Borys et al., The role of particle morphology in interfacial energy transfer in CdSe/Cds heterostructure nanocrystals, *Science* (Dec. 2010), 3(330):1371-1374 (Abstract).

Chen et al., Single-source precursor route for overcoating CdS and ZnS shells around CdSe core nanocrystals, *Frontiers of Chemistry in China* (Jun. 1, 2010), 5(2):214-220 (Abstract).

Chen et al., Synthesis of rod-, twinrod-, and tetrapod-shaped CdS nanocrystals using a highly oriented solvothermal recrystallization technique, *Journal of Materials Chemistry* (Jan. 22, 2002), 12(:748-753 (Abstract).

Cho et al., Phase-tuned tetrapod-shaped CdTe nanocrystals by ligand effect, *Chem. Mater.* (Aug. 6, 2008), 20(17):5600-5609 (Abstract).

Cozzoli et al., Shape and phase control of colloidal ZnSe nanocrystals, *Chem. Mater.* (Feb. 17, 2005), 17(6):1296-1306 (Abstract).

Deng et al., A new route to Zinc-Blende CdSe nanocrystals: mechanism and synthesis, *J. Phys. Chem. B* (Aug. 12, 2005), 109(35):16671-16675 (Abstract).

Donegá et al., Physicochemical evaluation of the hot-injection method, a synthesis route for monodisperse nanocrystals, *Small* (Oct. 28, 2005), 1(12):1152-1162 (Abstract).

Donegá et al., Single-step synthesis to control the photoluminescence quantum yield and size dispersion of CdSe nanocrystals, *J. Phys. Chem. B* (Dec. 12, 2002), 107(2):489-496 (Abstract).

Fang et al., Mechanical and electrical properties of CdTe tetrapods studied by atomic force microscopy, *J. Chem. Phys.* (Nov. 12, 2007), 127(18):284704-284709 (Abstract).

Fiore et al., Tetrapid-shaped colloidal nanocrystals of II-VI semiconductors prepared by seeded growth, *J. Am. Chem. Soc.* (Jan. 26, 2009), 131(6):2274-2282 (Abstract).

Govan et al., Chiral luminescent CdS nano-tetrapods, *Chemical Communications* (Jul. 23, 2010), 46(33):6072-6074 (Abstract).

Gur et al., Hybrid solar cells with prescribed nanoscale morphologies based on hyperbranched semiconductor nanocrystals, *Nano Lett.* (Dec. 29, 2006), 7(2):409-414 (Abstract).

Huang et al., Alkyl chains of surface ligands affect polytypism of CdSe nanocrystals and play an important role in the synthesis of anisotrophic nanoheterostructures, *J. Am. Chem. Soc.* (Oct. 22, 2010), 132(45):15866-15868 (Abstract).

Jana et al., Synthesis of tetrapod like PbS microcrystals by hydrothermal route and its optical characterization, *Journal of Alloys and Compounds* (Jul. 29, 2009), 481(1-2):806-810 (Abstract).

Jun et al., Architectural control of magnetic semiconductor nanocrystals, *J. Am Chem. Soc.* (Jan. 4, 2002), 124(4):615-619 (Abstract).

Ko et al., CdSe tetrapod synthesis using cetyltrimethylammonium bromide and heat transfer fluids, *Journal of Materials Chemistry* (Feb. 11, 2010), 20(12):2474-2478 (Abstract).

Kumar et al., Shape control of II-VI semiconductor nanomaterials, *Small* (Jan. 13, 2006), 2(3):316-329 (Abstract).

Kwak et al., Tuning the energy bandgap of CdSe nanocrystals via Mg doping, *Nanotechnology* (Apr. 23, 2007), 18:205702-205705.

Lazzarini et al., Unpredicted nucleation of extended zinc blende phases in Wurtzite ZnO nanotetrapod arms, *ACS Nano.* (Sep. 9, 2009), 3(10):3158-3164 (Abstract).

Li et al., High-yeild fabrication and electrochemical characterization of tetrapodal CdSe, CdTe, and $CdSe_xTe_{1-x}$ nanocrystals, *Advanced Functional Materials* (Jul. 20, 2006), 16(13): 1705-1716 (Abstract).

Li et al., Large-scale synthesis of nearly monodispoerse CdSe/CdS core/shell nanocrystals using air-stable reagents via successive ion layer adsorption and reaction, *J. Am. Chem. Soc.* (Sep. 23, 2003), 125(41):12567-12575 (Abstract).

Liu et al., Preparation of asymmetric nanostructures through site selective modification of tetrapods, *Nano Letters* (Nov. 10, 2004), 4(12):2397-2401 (Abstract).

Liu et al., Preparation of CdSe quantum dots with full color emission based on a room temperature injection technique, *Inorg. Chem.* (May 1, 2008), 47(11):5022-5028 (Abstract).

Liu et al., Shape contrl of CdSe nanocrystals with zinc blende structure, *J. Am. Chem. Soc.* (Oct. 26, 2009), 131(45):16423-16429 (Abstract).

Mahler et al., Ligand-controlled polytypism of thick-shell CdSe/CdS nanocrystals, *J. am. Chem. Soc.* (Dec. 31, 2009), 132(3):953-959 (Abstract).

Malkmus et al., Electron-hole dynamics in CdTe tetrapods, *J. Phys. Chem. B* (Aug. 15, 2006), 110(35):17334-17338 (Abstract).

Manna et al., Controlled growth of tetrapod-branched inorganic nanocrystals, *Nature Materials* (May 25, 2003), 2:382-385 (Abstract).

Manna et al., Synthesis of soluable and processable rod-, arrow-, teardrop-, and tetrapod-shaped CdSe nanocrystals, *J. Am. Chem. Soc.* (Dec. 1, 2000), 122(51):12700-12706 (Abstract).

Manna et al., Epitaxial growth and photochemical annealing of graded CdS/ZnS shells on colloidal CdSe nanorods, *J. Am. Chem. Soc.* (Jun. 19, 2002), 124:7136-7145.

Mohamed et al., Chemical synthesis and optical properties of size-selected CdSe tetrapod-shaped nanocrystals, *ChemPhysChem* (Nov. 18, 2005), 6(12):2505-2507 (Abstract).

Mokari et al., Selective growth of metal tips onto semiconductor quantum rods and tetrapods, *Science* (Jun. 18, 2004), 304(5678):1787-1790 (Abstract).

Murray et al., Synthesis and characterization of nearly monodisperse CdE (E = sulfur, selenium, tellurium) semiconductor nanocrystallites, *J. Am. Chem. Soc.* (Sep. 1993), 115(19):8706-8715 (Abstract).

Na et al., Morphology-controlled lead selenide nanocrystals and their in situ growth on carbon nanotubes, *J. Phys. Chem. C* (Jul. 9, 2008), 112(30):11218-11226 (Abstract).

Nobile et al., Probe tips functionalized with colloidal nanocrystals tetrapods for high-resolution atomic force microscopy imaging, *Small* (Nov. 4, 2008), 4(12):2123-2126 (Abstract).

Pang et al., CdSe nano-tetrapods: controllable synthesis, structure analysis, and electronic and optical properties, *Chem. Mater.* (Sep. 21, 2005), 17(21): 5263-5267(Abstract).

Peng et al., Formation of high-quality CdTe, CdSe, and CdS nanocrystals using CdO as precursor, *J. Am. Chem. Soc.* (Dec. 9, 2000), 123(1):183-184 (Abstract).

Peng et al., Nearly monodisperse and shape-controlled CdSe nanocrystals via alternative routes: nucleation and growth, *J. Am. Chem. Soc.* (Mar. 9, 2002), 124(13):3343-3353 (Abstract).

Qu et al., Control of photoluminescence properties of CdSe nanocrystals in growth, *J. Am. Chem. Soc.* (Feb. 6, 2002), 124(9):2049-2055 (Abstract).

(56) References Cited

OTHER PUBLICATIONS

Sambur et al., Multiple exciton collection in a sensitized photovoltaic system, *Science* (Oct. 1, 2010), 330(6600):63-66 (Abstract).

Talapin et al., Highly luminescent monodisperse CdSe and CdSe/ZnS nanocrystals synthesized in a hexadecylamine-trioctylphosphine oxide-trioctylphosphine mixture, *Nano Letters* (Mar. 16, 2001), 1(4):207-211 (Abstract).

Talapin et al., Prospects of colloidal nanocrystals for electronic and optoelectronic applications, *Chem. Rev.* (Dec. 3, 2009), 110(1):389-458 (Abstract).

Talapin et al., Seeded growth of highly luminescent CdSe/CdS nanoheterostructures with rod and tetrapod morphologies, *Nano Letters* (Sep. 11, 2007), 7(10):2951-2959 (Abstract).

Xia et al., Structural evolution and photoluminescence of zinc-blende CdSe-based CdSe/ZnS nanocrystals, *J. Phys. Chem. C* (Jul. 23, 2010), 114(32):13414-13420 (Abstract).

Xie et al., Design and synthesis of colloidal nanocrystals heterostructures with tetrapod morphology, *Small* (Oct. 27, 2006), 2(12):1454-1457 (Abstract).

Xie et al., Synthesis and characterization of highly luminescent CdSe-core CdS/$Zn_{0.5}Cd_{0.5}$S/ZnS multishell nanocrystals, *J. Am. Chem. Soc.* (Apr. 29, 2005), 127(20):7480-7488 (Abstract).

Yang et al., Synthesis of CdSe and CdTe Nanocrystals without Precursor Injection, *Angewandte Chemie* (Sep. 27, 2005), 117(41):6870-6873 (Abstract).

Yong et al., Shape control of PbSe nanocrystals using noble metal seed particles, *Nano Letters* (Feb. 28, 2006), 6(4):709-714 (Abstract).

Yong et al., Shape control of CdS nanocrystals in one-pot synthesis, *J. Phys. Chem. C* (Jan. 23, 2007), 111(6):2447-2458 (Abstract).

Zhang et al., Design and synthesis of highly luminescent near-infrared-emitting water-soluble CdTe/CdSe/ZnS core/shell/shell quantum dots, *Inorg. Chem.* (Sep. 22, 2009), 48(20):9723-9731 (Abstract).

Zhong et al., Facile and reproducible synthesis of red-emitting CdSe nanocrystals in amine with long-term fixation of particle size and size distribution, *J. Phys. Chem. C* (Dec. 10, 2006), 111(2):526-531 (Abstract).

Zhong et al., Nonhydrolytic alcoholysis route to morphology-controlled ZnO nanocrystals, *Small* (Apr. 11, 2007), 3(7):1194-1199 (Abstract).

Zhong et al., Composition-tunable $Zn_xCd_{1-x}Se$ nanocrystals with high luminescence and stability, *J. Am. Chem. Soc.* (Jun. 21, 2003), 125(28):8589-8594 (Abstract).

Zhong et al., Alloyed $Zn_xCd_{1-x}$ nanocrystals with highly narrow luminescence spectral width, *J. Am. Chem. Soc.* (Oct. 9, 2003), 125(44):13559-13563 (Abstract).

Zhuang et al., Direct synthesis or water-soluable ultrathin CdS nanorods and reversible tuning of the solubility of alkalinity, *J. Am. Chem. Soc.* (Jan. 26, 2010), 132(6):1819-1821 (Abstract).

Zlateva et al., Precise size control and synchronized synthesis of six colors of CdSe quantum dots in a slow-increasing temperature gradient, *Inorg. Chem.* (Jun. 30, 2007), 46(16):6212-6214 (Abstract).

Zou et al., Noninjection Synthesis of CdS and Alloyed $CdS_xSe_{1-x}$ Nanocrystals Without Nucleation Initiators, *Nanoscale Res Lett.* (Apr. 11, 2010), 5(6):966-971 (Abstract).

Farva et al., Influence of thermal annealing on the structural and optical properties of CdSe nanoparticles, *Solar Energy Materials and Solar Cells* (Nov. 4, 2009), 94(2):303-309.

Gokhberg et al., Electron (hole) paramagnetic resonance of spherical CdSe nanocrystals, *The Journal of Chemical Physics* (Nov. 11, 2001), 1171-5.

Hamizi et al., Synthesis and size dependent optical studies in CdSe quantum dots via inverse micelle technique, *Materials Chemistry and Physics* (Jun. 21, 2010), 124(1):395-398.

Han et al., Synthesis of high quality zinc-blende CdSe nanocrystals and their application in hybrid solar cells, *Nanotechnology* (Sep. 1, 2006), 17(18):4736-4742.

Luan et al., Open-to-air synthesis of monodisperse CdSe nanocrystals via microfluidic reaction and its kinetics, *Nanotechnology* (Apr. 2, 2007), 18(17):5603-5609.

Dai, Colloidal CdSe Nanocrystals Synthesized in Noncoordinating Solvents with the Addition of a Secondary Ligand: Exceptional Growth Kinetics, Journal of Physical Chemistry B (Jul. 28, 2006), 110:15608-16513.

Luyen et al., Effect of reaction temperature and ligand concentration on the shape of CdSe nanocrystals, International Journal of Nanotechnology (2011), 8(3-5)214-226.

\* cited by examiner

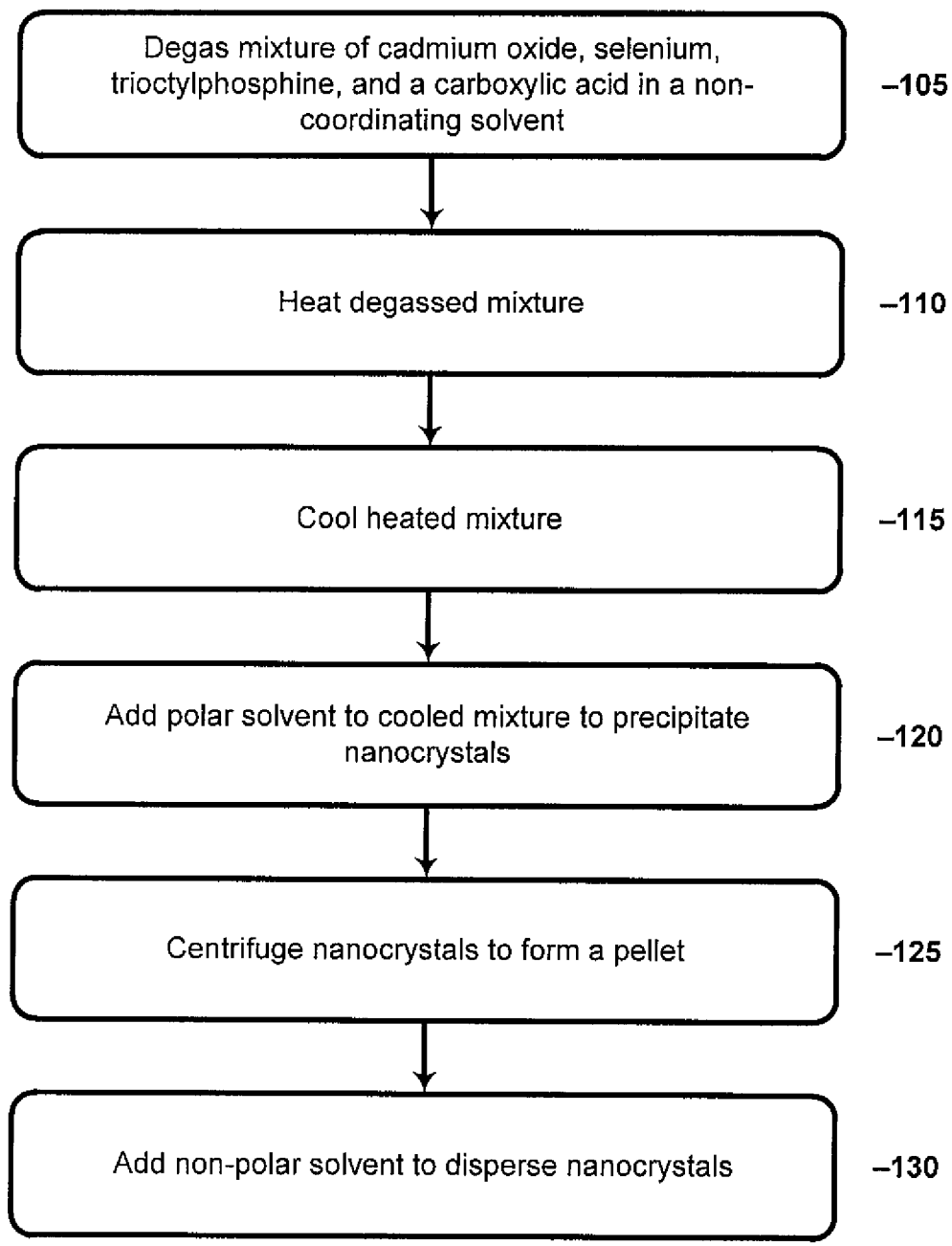

METHODS OF PRODUCING CADMIUM SELENIDE MULTI-POD NANOCRYSTALS

BACKGROUND

CROSS-REFERENCE TO RELATED APPLICATION

This application is a U.S. national stage filing under 35 U.S.C. §371 of International Application No. PCT/CN2011/083639, entitled "Methods Of Producing Cadmium Selenide Multi-Pod Nanocrystals", filed Dec. 7, 2011, which is incorporated herein by reference in its entirety.

Branched topologies of nanocrystals, especially the multi-podal (including tripodal and tetrapodal) shape, can potentially lead to a variety of interesting mechanical, optical/electric, and chemical properties different from those of spherical nanoparticles, and are thus useful in the reinforcement of polymers, assembly of materials, and fabrication of photovoltaic devices. However, the commonly adopted hot-injection methods for synthesizing branched nanocrystals, in which precursor solutions are rapidly introduced into heated organic solvent, are difficult to scale up for synthesizing nanocrystals in large quantities.

SUMMARY

This disclosure is not limited to the particular systems, devices and methods described, as these may vary. The terminology used in the description is for the purpose of describing the particular versions or embodiments only, and is not intended to limit the scope. While various compositions and methods are described in terms of "comprising" various components or steps (interpreted as meaning "including, but not limited to"), the compositions and methods can also "consist essentially of" or "consist of" the various components and steps, and such terminology should be interpreted as defining essentially closed-member groups.

Methods describe novel and simple processes comprising, among other things, the production of a multi-podal semiconductor nanocrystal. In some embodiments, methods of fabricating a core shell multi-podal semiconductor nanocrystal are described. The non-hot-injection methods described herein may allow facile scale-up for industrial scale production of multi-podal semiconductor nanocrystals and core shell multi-podal semiconductor nanocrystals.

In an embodiment, a method of producing a semiconductor nanocrystal may include heating a degassed mixture comprising a first metal compound, a second metal compound, a ligand, and a carboxylic acid in a non-coordinating solvent from about room temperature to about 210° C., where the semiconductor nanocrystal may be a multi-podal semiconductor nanocrystal and may be a core shell semiconductor nanocrystal.

In an embodiment, a method of producing a multi-podal cadmium selenide nanocrystal may include heating a degassed mixture comprising cadmium oxide, selenium, trioctylphosphine, and a carboxylic acid in a non-coordinating solvent from, about room temperature to about 210° C., where the multi-podal cadmium selenide nanocrystal may be a tetrapodal cadmium selenide nanocrystal.

In an embodiment, a method of producing a core shell multi-podal nanocrystal may include heating a degassed first mixture comprising cadmium oxide, selenium, trioctylphosphine, and a carboxylic acid in a first non-coordinating solvent from about room temperature to about 210° C. followed by adding a second mixture comprising zinc dimethyldithiocarbamate and a first amine in a second non-coordinating solvent, a third mixture comprising zinc acetate and a second amine in a third non-coordinating, a portion of a third amine, and further heating at about 200° C.

In an embodiment, a method of producing a cadmium sulfide nanocrystal may include heating a degassed mixture comprising cadmium oxide, sulfur, trioctylphosphine, and oleic acid in paraffin from about room temperature to about 210° C.

In an embodiment, a method of producing a cadmium telluride nanocrystal may include heating a degassed mixture comprising cadmium oxide, tellurium, trioctylphosphine, and oleic acid in paraffin from about room temperature to about 210° C.

In an embodiment, a kit for producing a semiconductor nanocrystal may include a first metal compound, a second metal compound, a ligand, a carboxylic acid and a first non-coordinating solvent; and may further include zinc dimethyldithiocarbamate, a first amine, a second non-coordinating solvent, zinc acetate, a second amine, a third non-coordinating solvent, and a third amine.

BRIEF DESCRIPTION OF THE DRAWINGS

FIG. 1 is a flowchart that illustrates an exemplary method for fabricating a multi-podal semiconductor nanocrystal, in accordance with an embodiment.

DETAILED DESCRIPTION

Described herein are methods for the non-hot-injection, gram-scale synthesis of a cadmium selenide multi-pod nanocrystal in high yield with use of cadmium oxide and selenium powder directly as reactants in paraffin media. Reactants may be commercial available and the advanced preparation of precursor stock solutions may not be required. The methods described herein may be low-cost, reproducible, and scalable. Deposition of zinc sulfide around a cadmium selenide multi-pod nanocrystal may produce a multi-pod cadmium selenide/zinc sulfide nanocrystal which may have a photoluminescence quantum yield of up to 85%. The described non-hot-injection methods may be used in the large-scale preparation of other semiconductor nanocrystals with multi-pod or other morphologies.

In embodiments, cadmium selenide multi-pod nanocrystals may be prepared by heating a mixture comprising cadmium oxide, selenide powder, and small amounts of oleic acid and trioctylphosphine (TOP) in paraffin solvent at about room temperature to a temperature of about 160° C. to about 250° C. The progression of the reaction may be ascribed to the in situ formation of cadmium oleate and TOP-selenide at high temperature. In some embodiments, cadmium oxide and selenium powder may be added to a mixture containing trioctylphosphine, oleic acid, and paraffin at room temperature. In such embodiments, cadmium oxide and selenium may dissolve gradually at about 160° C. and the initially turbid mixture may turn a transparent light-red color. In some embodiments, the mixture may be heated to about 210° C. and the growth/annealing of cadmium selenide multi-pod nanocrystals may be essentially finished in about 10 min. In embodiments, UV-vis absorption and photo luminescence emission spectra may be used to follow the temporal evolution of cadmium selenide nanocrystals as they grow/anneal. In some embodiments, a sharp first excitonic absorption peak in the UV spectra and a narrow and symmetric emission peak in the photoluminescence emission spectra may indicate that the particle size and shape are nearly monodispersed. In embodiments where the growth/annealing time of the cadmium selenide multi-pod nanocrystals is about 30 minutes and samples are taken from about 1 minute to about 30 minutes, the photoluminescence emission peak position may shift from about 573 nm to about 607 nm with a full width at half-maximum (FWHM) in the range of about 24 nm to about 27 nm. The photoluminescence quantum yield of the produced cadmium selenide multi-pod nanocrystals may be less than about 3%.

In embodiments, gram-scale quantities of cadmium selenide multi-pod nanocrystals may be prepared without post preparative size sorting. In some embodiments, cadmium selenide multi-pod nanocrystals may account for about 90% to about 100% of the produced nanocrystals and the products may be essentially free of spherical particles. In embodiments, the aspect ratio of cadmium selenide multi-pod nanocrystal arms (length/width) may remain essentially constant at different growth times. For example, the average arm length of cadmium selenide multi-pod nanocrystals with a growth time of about 2 minutes may be about 6.7 nm with an arm width of about 2.1 nm, and with about 30 minutes of growth time the average arm length may be about 12.2 nm and the arm width may be about 3.4 nm.

In embodiments, the photoluminescence emission efficiency of the cadmium selenide multi-pod nanocrystals may be improved by depositing a higher band gap material such as zinc sulfide around the cadmium selenide core. In some embodiments, a zinc sulfide layer may form a type-I heterojunction with the cadmium selenide core, wherein the conduction band of the shell material is higher than that of core material while the valence band of the shell material is lower than that of the core material, and may thus confine excitons within the cadmium selenide core region and may enhance spatial direct radiative recombination at the cadmium selenide. In such embodiments, the first excitonic absorption peak in the absorption spectrum and the photoluminescence peak in the photoluminescence emission spectrum may be red-shifted and the photoluminescence emission efficiency may be enhanced for core shell multi-pod nanocrystals compared to multi-pod nanocrystals. For example, the formation of a zinc sulfide shell around the cadmium selenide core may cause the photoluminescence emission wavelength shift from the initial 585 nm to 630 nm and the photoluminescence quantum yield may be about 85% and the luminescence may be observed in room light.

In some embodiments, thermal decomposition of a molecular precursor such as zinc dimethyldithiocarbamate in the cadmium selenide crude reaction solution may provide a core shell multi-pod nanocrystal, wherein the core shell multi-pod nanocrystal may comprise a cadmium selenide core and a zinc sulfide shell. In further embodiments, the core shell multi-pod nanocrystal may comprise a cadmium selenide core and a shell comprising cadmium sulfide and zinc sulfide. In some embodiments, an equimolar amount of zinc stearate may be added with zinc dimethyldithiocarbamate in order to compensate for the missing quantity of zinc precursor in zinc dimethyldithiocarbamate wherein the zinc/sulfur ratio in zinc dimethyldithiocarbamate is 1:4. In some embodiments, the shell of the core shell multi-pod nanocrystals may comprise cadmium sulfide due to excess cadmium precursor used in the synthesis of the cadmium selenide nanocrystals and the sulfur contained in the zinc dimethyldithiocarbamate. The narrower band gap of cadmium sulfide ($E_g$=2.45 eV) compared to that of zinc sulfide ($E_g$=3.67 eV), may cause a greater red-shift of absorption and photoluminescence peaks for the deposition of cadmium sulfide shell than that of a zinc sulfide shell. In further embodiments, a cadmium sulfide shell may be deposited by the thermal decomposition of a molecular precursor such as cadmium dimethyldithiocarbamate in the cadmium selenide crude reaction solution followed by the deposition of a zinc sulfide shell. In these embodiments, the photoluminescence emission wavelength may be further red-shifted to about 664 nm. In some embodiments, using larger nanocrystal core materials may lead to longer emission wavelengths for the core shell nanostructures. In embodiments, the original multi-pod morphology may be conserved when depositing a shell comprising zinc sulfide and/or cadmium sulfide onto a cadmium selenide multi-podal nanocrystal.

In embodiments, parameters including but not limited to growth temperature, nature and amount of surfactants, cadmium to selenide ratio, and nature of reactants may be varied. In some embodiments, a higher growth temperature such as about 230° C. to about 250° C. may lead to formation of multi-pods with larger-sized diameter of arms. Higher temperatures may provide a higher concentration of dissolved monomer, which may promote the radial growth direction of rods. In some embodiments, oleic acid may be replaced with stearic acid or dodecanoic acid. Embodiments using dodecanoic acid may produce multi-podal nanocrystals with longer arm lengths and larger aspect ratios than the other two acids. In some embodiments, decreasing the ratio of trioctylphosphine may provide multi-pods with shorter arm lengths. In some embodiments, replacing the paraffin solvent with another non-coordinating solvent such as 1-octadecene may result in essentially no variation in the produced nanocrystals. In some embodiments, cadmium to selenium ratios of 1.5:1, 1:1, and 1:1.5 may be used to produce nanocrystals. In these embodiments, a molar excess of cadmium may favor the formation of longer-armed multi-pods. In some embodiments, cadmium oxide may be replaced by cadmium oleate and/or selenium may be replaced by TOP-selenium. In these embodiments, the produced multi-pod morphology may be preserved. In further embodiments, the herein described non-hot-injection methods may be used in the preparation of other II-VI group semiconductor nanocrystals. In some embodiments, cadmium sulfide and cadmium telluride nanocrystals may be prepared.

In embodiments, a carboxylic acid may comprise, but is not limited to, formic acid, acetic acid, chloroacetic acid, dichloroacetic acid, trichloroacetic acid, trifluoroacetic acid, oxalic acid, benzoic acid, methanoic acid, ethanoic acid, propanoic acid, butanoic acid, pentanoic acid, hexanoic acid, heptanoic acid, octanoic acid, nonanoic acid, decanoic acid, dodecanoic acid, tetradecanoic acid, hexadecanoic acid, octadecanoic acid, icosanoic acid, myristoleic acid, palmitoleic acid, sapienic acid, oleic acid, elaidic acid, vaccenic acid, linoleic acid, linoelaidic acid, α-linolenic acid, arachidonic acid, eicosapentaenoic acid, erucic acid, docosahexaenoic acid, or combinations thereof. In some embodiments, the carboxylic acid may comprise oleic acid.

In embodiments, a non-coordinating solvent may have a boiling point above about 250° C. In some embodiments, a non-coordinating solvent may comprise, but is not limited to, paraffin, octadecene, diesel oil, or combinations thereof.

In embodiments, a polar solvent may comprise, but is not limited to, dichloromethane (DCM), tetrahydrofuran (THF), ethyl acetate, acetone, dimethylformamide (DMF), acetonitrile (MeCN), dimethyl sulfoxide (DMSO), formic acid, n-butanol, isopropanol (IPA), n-propanol, ethanol, methanol, acetic acid, water, or combinations thereof.

In embodiments, a non-polar solvent may comprise, but is not limited to, pentane, cyclopentane, hexane, cyclohexane, benzene, toluene, 1,4-dioxane, chloroform, or diethyl ether.

In embodiments, an amine may comprise aliphatic amine comprising, but not limited to, an 8-carbon to 18-carbon hydrocarbon chain.

In an embodiment, a method of producing a semiconductor nanocrystal may comprise degassing a mixture comprising a first inorganic compound, an second inorganic compound, a ligand, and a carboxylic acid in a non-coordinating solvent at a temperature of about 20° C. to about 120° C. and heating the degassed mixture from the degassing temperature to a temperature of about 160° C. to about 300° C. The first inorganic compound may comprise a period II to period VI element, and the second inorganic compound may comprise a period IV to period VI element. In some embodiments, the ligand may be trioctylphosphine. In embodiments, the semiconductor nanocrystal may comprise zinc oxide, zinc sulfide, zinc telluride, zinc selenide, cadmium sulfide, cadmium selenide, cadmium telluride, lead sulfide, or lead selenide. In embodiments, the first metal compound may comprise cadmium oxide, zinc oxide, or lead oxide. In embodiments, the second metal compound may comprise sulfur, selenium, or tellurium. In some embodiments, the mixture may be degassed at about 23° C. In some embodiments, the mixture may be heated to a temperature of about 190° C. to about 250° C. In other embodiments, the mixture may be heated to about 210° C. In some embodiments, the semiconductor nanocrystal may comprise a multi-podal semiconductor nanocrystal. In other embodiments, the semiconductor nanocrystal may comprise a tetrapodal semiconductor nanocrystal. In further embodiments, a shell may be deposited around the semiconductor nanocrystal to produce a core shell semiconductor nanocrystal; wherein the shell may form a type I heterojunction with the core. In some embodiments, the shell may comprise zinc sulfide and/or cadmium sulfide. In some embodiments, the photoluminescence quantum yield of the semiconductor nanocrystal may be greater than about 80%. In embodiments, semiconductor nanocrystals may be purified by the centrifugation steps described herein.

In an embodiment and as shown in FIG. 1, a method of producing a multi-podal cadmium selenide nanocrystal may comprise degassing 105 a mixture comprising cadmium oxide, selenium, trioctylphosphine, and a carboxylic acid in a non-coordinating solvent at a temperature of about 20° C. to about 120° C. and heating 110 the degassed mixture from the degassing temperature to a temperature of about 160° C. to about 300° C. In some embodiments, the mixture may be degassed at about 20° C. to about 60° C. In other embodiments, the mixture may be degassed at about 23° C. In some embodiments, the mixture may be heated to a temperature of about 190° C. to about 250° C. In other embodiments, the mixture may be heated to about 210° C. In embodiments, the mixture may be heated at a rate of about 4° C. to about 30° C. per minute. In some embodiments, the mixture may be heated at a rate of about 20° C. per minute. In embodiments, the temperature of the mixture may be maintained at about 190° C. to about 300° C. for about 1 minute to about 120 minutes. In some embodiments, the temperature of the mixture may be maintained at about 190° C. to about 300° C. for about 2 minutes to about 30 minutes. In other embodiments, the temperature of the mixture may be maintained at about 190° C. to about 300° C. for about 2 minutes to about 10 minutes. In some embodiments, the multi-podal cadmium selenide nanocrystals may comprise tetrapodal cadmium selenide nanocrystals. In embodiments, multi-podal cadmium selenide nanocrystals may be purified by the centrifugation steps described herein.

In embodiments, a heated mixture for producing nanocrystals may be cooled 115 and a polar solvent may be added 120 to the cooled mixture to provide a liquid comprising precipitated nanocrystals. In these embodiments, the mixture may be cooled to a temperature of about 20° C. to about 100° C. In some embodiments, the mixture may be cooled to a temperature of about 80° C. In additional embodiments, the liquid comprising the precipitated nanocrystals may be centrifuged 125 to produce a pellet comprising precipitated nanocrystals in a supernatant. In these embodiments, the supernatant may be decanted to isolate the pellet comprising the precipitated nanocrystals, and a non-polar solvent may be added 130 to produce a dispersion of nanocrystals in the non-polar solvent. In some embodiments, the dispersion of nanocrystals may be centrifuged to provide a pellet comprising purified nanocrystals in the non-polar solvent. In these embodiments, the non-polar solvent may be decanted to isolate the pellet comprising purified nanocrystals, and a second non-polar solvent may be added to produce a dispersion of the purified nanocrystals in the second non-polar solvent. In some embodiments, the steps of centrifuging the dispersion, decanting the solvent, and adding a further solvent may be repeated at least once to produce a dispersion of suitably purified nanocrystals in the further solvent. In embodiments, nanocrystals may be dried in ambient conditions, by flowing gas, or under vacuum.

In an embodiment, a method of producing a core shell multi-podal nanocrystal may comprise degassing a first mixture comprising cadmium oxide, selenium, trioctylphosphine, and a carboxylic acid in a first non-coordinating solvent at a temperature of about 20° C. to about 120° C.; heating the degassed first mixture to elevate the temperature of the mixture from the degassing temperature to a temperature of about 160° C. to about 300° C.; cooling the first mixture to a temperature of about 120° C. to about 160° C.; adding to the cooled first mixture a second mixture comprising zinc dimethyldithiocarbamate and a first amine in a second non-coordinating solvent at a temperature of about 20° C. to about 100° C., a third mixture comprising zinc acetate and a second amine in a third non-coordinating solvent at a temperature of about 100° C. to about 160° C., and a portion of a third amine to produce a fourth mixture; maintaining the temperature of the fourth mixture at a temperature of about 120° C. to about 160° C. for about 30 minutes; heating the fourth mixture to a temperature of about 140° C. to about 200° C.; and maintaining the temperature of the fourth mixture at a temperature of about 140° C. to about 200° C. for about 20 minutes. In some embodiments, the first mixture may be degassed at about 20° C. to about 60° C. In other embodiments, the first mixture may be degassed at about 23° C. In some embodiments, the first mixture may be heated to a temperature of about 190° C. to about 250° C. In other embodiments, the first mixture may be heated to about 210° C. In embodiments, the first mixture may be heated at a rate of about 4° C. to about 30° C. per minute. In some embodiments, the first mixture may be heated at a rate of about 20° C. per minute. In embodiments, the temperature of the first mixture may be maintained at about 190° C. to about 300° C. for about 1 minute to about 120 minutes. In some embodiments, the temperature of the first mixture may be maintained at about 190° C. to about 300° C. for about 2 minutes to about 30 minutes. In other embodiments, the temperature of the first mixture may be maintained at about 190° C. to about 300° C. for about 2 minutes to about 10 minutes. Further embodiments may comprise cooling the fourth mixture to a temperature of about 120° C. to about 160° C.; adding to the cooled fourth mixture a fifth mixture comprising zinc dimethyldithiocarbamate and a fourth amine in a fourth non-coordinating solvent at a temperature of about 20° C. to about 100° C., a sixth mixture comprising zinc acetate and a fifth amine in a fifth non-coordinating solvent at a temperature of about 100° C. to about 160° C., and a portion of a sixth amine to produce a seventh mixture; maintaining the temperature of the seventh mixture at a temperature of about 120° C. to about 160° C. for about 30 minutes; heating the seventh mixture to a temperature of about 140° C. to about 200° C.; and maintaining the temperature of the seventh mixture a temperature of about 140° C. to about 200° C. for about 20 minutes. In embodiments, the core shell multi-podal nanocrystals may be purified by the centrifugation steps described herein. In some embodiments, the core shell multi-podal nanocrystal may comprise a shell comprising zinc sulfide and a core comprising cadmium selenide. In other embodiments, the core shell multi-podal nanocrystal may comprise a shell comprising zinc sulfide and cadmium sulfide and a core comprising cadmium selenide. In some embodiments, the photoluminescence quantum yield of the core shell multi-podal nanocrystal may be greater than about 80%. In some embodiments, the core shell multi-podal nanocrystal may comprise a core shell tetrapodal nanocrystal.

In an embodiment, a method of producing a cadmium sulfide nanocrystal may comprise degassing a mixture comprising cadmium oxide, sulfur, trioctylphosphine, and oleic acid in paraffin at a temperature of about 20° C. to about 120° C. and heating the degassed mixture from the degassing temperature to a temperature of about 160° C. to about 300° C.

In an embodiment, a method of producing a cadmium telluride nanocrystal may comprise degassing a mixture comprising cadmium oxide, tellurium, trioctylphosphine, and oleic acid in paraffin at a temperature of about 20° C. to about 120° C. and heating the degassed mixture from the degassing temperature to a temperature of about 160° C. to about 300° C.

In an embodiment, a kit for producing a semiconductor nanocrystal may comprise a first metal compound, a second metal compound, a ligand, a carboxylic acid, and a first non-coordinating solvent. The first metal compound may comprise a period II to period VI elements and the second metal compound may comprise a period IV to period VI element. In embodiments, the ligand may comprise trioctylphosphine. In embodiments, the semiconductor nanocrystal may comprise zinc oxide, zinc sulfide, zinc telluride, zinc selenide, cadmium sulfide, cadmium selenide, cadmium telluride, lead sulfide, or lead selenide. In some embodiments, the first metal compound may comprise cadmium oxide. In some embodiments, the second metal compound may comprise sulfur, selenium, and tellurium. In some embodiments, the semiconductor nanocrystal may comprise a multi-podal semiconductor nanocrystal. In farther embodiments, the semiconductor nanocrystal may comprise a tetrapodal semiconductor nanocrystal. In additional embodiments, the kit may further comprise zinc dimethyldithiocarbamate, a first amine, a second non-coordinating solvent, zinc acetate, a second amine, a third non-coordinating solvent, and a third amine. In some embodiments, the semiconductor nanocrystal may comprise a core shell semiconductor nanocrystal. In further embodiments, the shell may form a type I heterojunction with the core. In additional embodiments, the shell may comprise zinc sulfide. In some embodiments, the shell may comprise zinc sulfide and cadmium sulfide. In some embodiments, the photoluminescence quantum yield of the semiconductor nanocrystal may be greater than about 80%. In further embodiments, the kit may comprise instructions for producing semiconductor nanocrystal from the contents of the kit.

EXAMPLES

Example 1

Synthesis of Multi-Podal Cadmium Selenide Nanocrystals

Cadmium oxide (1.15 g, 9 mmol) and selenide (100 mesh, 0.47 g, 6 mmol) were mixed with 10.0 mL of trioctylphosphine, 15.0 mL of oleic acid, and 150 mL of paraffin in a 500 mL three-necked flask. The mixture was then degassed at room temperature for 5 min. After that, the solution was heated to 210° C. at a heating rate of 20° C./min under $N_2$ flow. During the reaction, aliquots were taken with a syringe at different times to monitor the growth of cadmium selenide nanocrystals by recording UV-vis absorption and photoluminescence emission spectra. Afterward, the reaction solution was cooled to about 80° C. and precipitated by acetone. The flocculent precipitate that formed was centrifuged, while the supernatant liquid was decanted, and the isolated solid was dispersed in toluene or chloroform. The above centrifugation and isolation procedure was then repeated several times for purification of the prepared cadmium selenide nanocrystals. Finally, the products were redispersed in toluene or chloroform or dried under vacuum for further analyses. Product yield was 90% based on selenide (1.01 g of cadmium selenide nanocrystals).

Example 2

Deposition of Zinc Sulfide Shell Around Cadmium Selenide Multi-Pod Nanocrystals

Similar to Example 1, cadmium selenide core nanocrystals were synthesized using 0.15 mmol of cadmium oxide, 0.1 mmol of selenide powder in 4.0 mL of paraffin containing 0.2 mL of TOP, and 0.3 mL of oleic acid. After growing the cadmium selenide nanocrystals at 210° C. for 2 min, the reaction temperature was lowered to 140° C. and 0.3 mL of 0.1 M zinc dimethyldithiocarbamate (ZDC) stock solution (prepared by the dissolution of zinc dimethyldithiocarbamate in 1:1 oleyl amine/paraffin at room temperature), and 0.3 mL of 0.4 M zinc acetate solution (obtained by dissolution of 8 mmol of zinc acetate in 6.0 mL oleyl amine and 14 mL paraffin at 120° C.) were added into the reaction system, followed by the addition of 0.5 mL oleyl amine. The reaction temperature was kept at 140° C. for another 30 min. After that, reaction temperature was raised to 200° C. and kept for 20 min. When the optical spectra showed no further changes, a second deposition cycle of the zinc sulfide shell was performed with the use of equal amounts of precursors following the same heating procedure. After finishing shell deposition, the purification of the obtained core shell nanocrystals was similar to that of plain cadmium selenide core nanocrystals in Example 1.

In the present disclosure, reference is made to the accompanying FIGURES, which form a part hereof. The illustrative embodiments described in the detailed description, FIGURE, and claims are not meant to be limiting. Other embodiments may be used, and other changes may be made, without departing from the spirit or scope of the subject matter presented herein. It will be readily understood that the aspects of the present disclosure, as generally described herein, and illustrated in the FIGURE, may be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarify.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc," is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.), it will be further understood by those within the art that virtually any disjunctive word and/or phrase presenting two or more alternative terms, whether in the description, claims, or FIGURE, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 substituents refers to groups having 1, 2, or 3 substituents. Similarly, a group having 1-5 substituents refers to groups having 1, 2, 3, 4, or 5 substituents, and so forth.

What is claimed is:

1. A method of producing a semiconductor nanocrystal, the method comprising:
   degassing a mixture comprising a first inorganic compound, a second inorganic compound, a nanocrystal-forming ligand, and a carboxylic acid in a non-coordinating solvent at a temperature of about 20° C. to about 120° C.;
   wherein the first inorganic compound comprises a period II to period VI element and the second inorganic compound comprises a period IV to period VI element; and
   heating the mixture to elevate the temperature of the mixture from the degassing temperature to a temperature of about 160° C. to about 300° C. to produce the semiconductor nanocrystal,
   wherein the semiconductor nanocrystal comprises a multi-podal semiconductor nanocrystal.

2. The method of claim 1, wherein the semiconductor nanocrystal is selected from the group consisting of zinc oxide, zinc sulfide, zinc telluride, zinc selenide, cadmium sulfide, cadmium selenide, cadmium telluride, lead sulfide, and lead selenide.

3. The method of claim 1, wherein the first inorganic compound is selected from the group consisting of cadmium oxide, zinc oxide, and lead oxide.

4. The method of claim 1, wherein the second inorganic compound includes an element selected from the group consisting of sulfur, selenium, and tellurium.

5. The method of claim 1, wherein the semiconductor nanocrystal comprises a tetrapodal semiconductor nanocrystal.

6. The method of claim 1, further comprising adding a solution comprising a shell material to the semiconductor nanocrystal to produce a core shell semiconductor nanocrystal.

7. The method of claim 6, wherein the shell comprises zinc sulfide.

8. A method of producing a multi-podal cadmium selenide nanocrystal, the method comprising:
 degassing a mixture comprising cadmium oxide, selenium, trioctylphosphine, and a carboxylic acid in a non-coordinating solvent at a temperature of about 20° C. to about 120° C.; and
 heating the mixture to elevate the temperature of the mixture from the degassing temperature to a temperature of about 160° C. to about 300° C. to produce the multi-podal cadmium selenide nanocrystal.

9. The method of claim 8, wherein the carboxylic acid is selected from the group consisting of formic acid, acetic acid, chloroacetic acid, dichloroacetic acid, trichloroacetic acid, trifluoroacetic acid, oxalic acid, benzoic acid, methanoic acid, ethanoic acid, propanoic acid, butanoic acid, pentanoic acid, hexanoic acid, heptanoic acid, octanoic acid, nonanoic acid, decanoic acid, dodecanoic acid, tetradecanoic acid, hexadecanoic acid, octadecanoic acid, icosanoic acid, myristoleic acid, palmitoleic acid, sapienic acid, oleic acid, elaidic acid, vaccenic acid, linoleic acid, linoelaidic acid, α-linolenic acid, arachidonic acid, eicosapentaenoic acid, erucic acid, and docosahexaenoic acid.

10. The method of claim 8, wherein the carboxylic acid comprises oleic acid.

11. The method of claim 8, wherein heating the mixture comprises heating at a rate of about 4° C. to about 30° C. per minute.

12. The method of claim 8, further comprising maintaining the temperature of the mixture at about 190° C. to about 300° C. for about 2 minutes to about 120 minutes.

13. The method of claim 8, further comprising:
 cooling the heated mixture; and
 adding a polar solvent to the cooled mixture to precipitate the multi-podal cadmium selenide nanocrystal in the polar solvent.

14. The method of claim 13, further comprising:
 centrifuging the liquid comprising the precipitated multi-podal cadmium selenide nanocrystal to produce a pellet comprising the precipitated multi-podal cadmium selenide nanocrystal in a supernatant;
 decanting the supernatant to isolate the pellet comprising the precipitated multi-podal cadmium selenide nanocrystal; and
 adding a non-polar solvent to the pellet comprising the precipitated multi-podal cadmium selenide nanocrystal to produce a dispersion of the multi-podal cadmium selenide nanocrystal in the solvent.

15. The method of claim 14, further comprising:
 centrifuging the dispersion of the multi-podal cadmium selenide nanocrystal to provide a pellet comprising a purified multi-podal cadmium selenide nanocrystal in the non-polar solvent;
 decanting the non-polar solvent to isolate the pellet comprising the purified multi-podal cadmium selenide nanocrystal; and
 adding a second non-polar solvent to the pellet comprising the purified multi-podal cadmium selenide nanocrystal to produce a dispersion of the purified multi-podal cadmium selenide nanocrystal in the second non-polar solvent.

16. The method of claim 8, further comprising drying the multi-podal cadmium selenide nanocrystal under vacuum.

17. A method of producing a core shell multi-podal nanocrystal, the method comprising:
 degassing a first mixture comprising cadmium oxide, selenium, trioctylphosphine, and a carboxylic acid in a first non-coordinating solvent at a temperature of about 20° C. to about 120° C.;
 heating the first mixture to elevate the temperature of the first mixture from the degassing temperature to a temperature of about 160° C. to about 300° C.;
 cooling the first mixture to a temperature of about 120° C. to about 160° C.;
 adding to the cooled first mixture a second mixture comprising zinc dimethyldithiocarbamate and a first amine in a second non-coordinating solvent at a temperature of about 20° C. to about 100° C., a third mixture comprising zinc acetate and a second amine in a third non-coordinating solvent at a temperature of about 100° C. to about 160° C., and a portion of a third amine to produce a fourth mixture;
 heating the fourth mixture from a temperature of about 140° C. to about 200° C.; and
 maintaining the temperature of the fourth mixture a temperature of about 140° C. to about 200° C. for about 20 minutes to produce a core shell multi-podal nanocrystal.

18. The method of claim 17, wherein heating the first mixture comprises heating at a rate of about 4° C. to about 30° C. per minute.

19. The method of claim 17, further comprising:
 cooling the fourth mixture to a temperature of about 120° C. to about 160° C.;
 adding to the cooled fourth mixture a fifth mixture comprising zinc dimethyldithiocarbamate and a fourth amine in a fourth non-coordinating solvent at a temperature of about 20° C. to about 100° C., a sixth mixture comprising zinc acetate and a fifth amine in a fifth non-coordinating solvent at a temperature of about 100° C. to about 160° C., and a portion of a sixth amine to produce a seventh mixture;
 heating the seventh mixture from a temperature of about 140° C. to about 200° C.; and
 maintaining the temperature of the seventh mixture at a temperature of about 140° C. to about 200° C. for about 30 minutes to produce a core shell multi-podal nanocrystal.

20. The method of claim 19, further comprising:
 cooling at least one of the fourth or seventh mixtures; and
 adding a polar solvent to the cooled fourth or seventh mixture to precipitate the core shell multi-podal nanocrystal in the polar solvent.

21. The method of claim 20, further comprising:
 centrifuging the liquid comprising the precipitated core shell multi-podal nanocrystal to provide a pellet comprising the precipitated core shell multi-podal nanocrystal in a supernatant;
 decanting the supernatant to isolate the pellet comprising the precipitated core shell multi-podal nanocrystal; and
 adding a non-polar solvent to the pellet comprising the precipitated core shell multi-podal nanocrystal to produce a dispersion of the core shell multi-podal nanocrystal in the non-polar solvent.

22. The method of claim 21, further comprising:
centrifuging the dispersion of the core shell multi-podal nanocrystal to provide a pellet comprising the purified core shell multi-podal nanocrystal in the non-polar solvent;
decanting the non-polar solvent to isolate the pellet comprising the purified core shell multi-podal nanocrystal; and
adding a second non-polar solvent to the pellet comprising the purified core shell multi-podal nanocrystal to produce a dispersion of the purified core shell multi-podal nanocrystal in the second non-polar solvent.

23. The method of claim 17, wherein producing the core shell multi-podal nanocrystal comprises producing a core shell multi-podal nanocrystal having a shell comprising zinc sulfide and a core comprising cadmium selenide.

24. The method of claim 17, wherein producing the core shell multi-podal nanocrystal comprises producing a core shell multi-podal nanocrystal comprising a core shell tetrapodal nanocrystal.

25. A method of producing a semiconductor nanocrystal, the method comprising:
degassing a mixture comprising a first inorganic compound, a second inorganic compound, a nanocrystal-forming ligand, and a carboxylic acid in a non-coordinating solvent at a temperature of about 20° C. to about 120° C.,
wherein the first inorganic compound comprises a period II to period VI element and the second inorganic compound includes an element selected from the group consisting of sulfur, selenium, and tellurium; and
heating the mixture to elevate the temperature of the mixture from the degassing temperature to a temperature of about 160° C. to about 300° C. to produce the semiconductor nanocrystal,
wherein the semiconductor nanocrystal comprises a multi-podal semiconductor nanocrystal.

* * * * *

UNITED STATES PATENT AND TRADEMARK OFFICE
CERTIFICATE OF CORRECTION

PATENT NO. : 9,493,351 B2
APPLICATION NO. : 13/811835
DATED : November 15, 2016
INVENTOR(S) : Zhong et al.

Page 1 of 2

It is certified that error appears in the above-identified patent and that said Letters Patent is hereby corrected as shown below:

In the Specification

In Column 1, Lines 3-24, delete "BACKGROUND

CROSS REFERENCE TO RELATED
APPLICATION

This application is a U.S. national stage filing under 35 U.S.C. §371 International Application No. PCT/CN2011/083639, entitled "Methods Of Producing Cadmium Selenide Multi-Pod Nanocrystals", filed Dec. 7, 2011, which is incorporated herein by reference in its entirety.
Branched topologies of nanocrystals, especially the multipodal (including tripodal and tetrapodal) shape, can potentially lead to a variety of interesting mechanical, optical/electric, and chemical properties different from those of spherical nanoparticles, and are thus useful in the reinforcement of polymers, assembly of materials, and fabrication of photovoltaic devices. However, the commonly adopted hot-injection methods for synthesizing branched nanocrystals, in which precursor solutions are rapidly introduced into heated organic solvent, are difficult to scale up for synthesizing nanocrystals in large quantities."
and insert
-- CROSS REFERENCE TO RELATED
APPLICATION This application is a U.S. national stage filing under 35 U.S.C. § 371 International Application No. PCT/CN2011/

Signed and Sealed this
Fourth Day of April, 2017

Michelle K. Lee
*Director of the United States Patent and Trademark Office*

CERTIFICATE OF CORRECTION (continued)
U.S. Pat. No. 9,493,351 B2

083639, entitled "Methods Of Producing Cadmium Selenide Multi-Pod Nanocrystals", filed Dec. 7, 2011, which is incorporated herein by reference in its entirety.

BACKGROUND

Branched topologies of nanocrystals, especially the multipodal (including tripodal and tetrapodal) shape, can potentially lead to a variety of interesting mechanical, optical/electric, and chemical properties different from those of spherical nanoparticles, and are thus useful in the reinforcement of polymers, assembly of materials, and fabrication of photovoltaic devices. However, the commonly adopted hot-injection methods for synthesizing branched nanocrystals, in which precursor solutions are rapidly introduced into heated organic solvent, are difficult to scale up for synthesizing nanocrystals in large quantities. --, therefor.

In Column 1, Line 59, delete "from, about" and insert -- from about --, therefor.

In Column 2, Line 62, delete "photo luminescence" and insert -- photoluminescence --, therefor.

In Column 7, Line 45, delete "period VI elements and" and insert -- period VI element, and --, therefor.

In Column 7, Line 56, delete "farther" and insert -- further --, therefor.

In Column 8, Line 63, delete "FIGURES," and insert -- figures, --, therefor.

In Column 8, Line 65, delete "FIGURE," and insert -- figure, --, therefor.

In Column 9, Line 3, delete "FIGURE," and insert -- figure, --, therefor.

In Column 9, Line 30, delete "clarify." and insert -- clarity. --, therefor.

In Column 9, Line 62, delete "etc,"" and insert -- etc." --, therefor.

In Column 10, Line 5, delete "FIGURE," and insert -- figure, --, therefor.